(12) United States Patent
Lee et al.

(10) Patent No.: US 7,732,335 B2
(45) Date of Patent: Jun. 8, 2010

(54) METHOD FOR FORMING PATTERN IN SEMICONDUCTOR DEVICE

(75) Inventors: Jung-Seock Lee, Kyoungki-do (KR); Ky-Hyun Han, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 349 days.

(21) Appl. No.: 11/824,025

(22) Filed: Jun. 29, 2007

(65) Prior Publication Data
US 2008/0160765 A1   Jul. 3, 2008

(30) Foreign Application Priority Data
Dec. 27, 2006   (KR) .................. 10-2006-0134369

(51) Int. Cl.
*H01L 21/76* (2006.01)
(52) U.S. Cl. ................ 438/700; 257/E21.249
(58) Field of Classification Search ............ 438/700; 257/E21.249
See application file for complete search history.

(56) References Cited

U.S. PATENT DOCUMENTS 7,018,930 B2 *   3/2006   Lee et al. ................. 438/706

FOREIGN PATENT DOCUMENTS

| JP | 5-13319 | 1/1993 |
|---|---|---|
| KR | 10-2004-0057502 | 7/2004 |
| KR | 10-2005-0019905 | 3/2005 |
| KR | 10-2005-0067500 | 7/2005 |
| KR | 10-2006-0010932 A | 2/2006 |
| KR | 10-2006-0074995 A | 7/2006 |
| KR | 10-0636919 B1 | 10/2006 |
| KR | 10-2006-0133642 | 12/2006 |

OTHER PUBLICATIONS

Coburn, Plasma-Assisted Etching, Plasma Chemistry and Plasma Processing, vol. 2, No. 1, 1982, pp. 1-6.*

* cited by examiner

*Primary Examiner*—W. David Coleman
*Assistant Examiner*—Sonya D McCall-Shepard
(74) *Attorney, Agent, or Firm*—Blakely, Sokoloff, Taylor & Zafman

(57) ABSTRACT

A method for forming a semiconductor device includes forming an etch target layer, forming a sacrificial hard mask layer having a metal layer and a carbon-based material layer on the etch target layer, forming a photoresist pattern on the carbon-based material layer, etching the carbon-based material layer by the photoresist pattern until a remaining carbon-based material portion has a predetermined thickness, etching the remaining carbon-based material portion until a corresponding metal layer portion is exposed to form a carbon-based material pattern, and etching the metal layer by using the carbon-based material pattern to form a hard mask pattern for forming the pattern.

17 Claims, 6 Drawing Sheets

METHOD FOR FORMING PATTERN IN SEMICONDUCTOR DEVICE

CROSS-REFERENCE TO RELATED APPLICATIONS

The present invention claims priority of Korean patent application number 10-2006-0134369, filed on Dec. 27, 2006 which is incorporated by reference in its entirety.

BACKGROUND OF THE INVENTION

The present invention relates to a method for fabricating a semiconductor device, and more particularly, to a method for forming a pattern in a semiconductor device.

As semiconductor devices are highly integrated, a line width of a pattern needs to be decreased. Reduction in the size of photoresist patterns formed by photolithography is also demanded. The main component of photoresist has been changed toward an easier patterning and the exposure technology has been developed toward decreasing the photoresist patterns. However, because of the changes in the main component and the size reduction in photoresist, photoresist patterns may be etched while etching proceeds due to a lack of etching margin. As a result, patterning of etch target layers may be difficult.

In order to solve the above described limitations, an etching margin is secured by interposing a sacrificial hard mask between a patterned etch target layer and a photoresist pattern. A double-layer hard mask structure having a different etching ratio is often considered more effective in securing an etching margin than a single-layer hard mask. In case of using a double-layer sacrificial hard mask structure, material types for hard mask is important, and the types for hard masks are already known.

The possibility of using a sacrificial hard mask structure particularly including an amorphous carbon layer and a tungsten layer is suggested in Korean published patent applications No. 10-2006-0074995 issued to S. K. Lee, et al., entitled "Method For Forming a Deep Contact Hole In Semiconductor Device" and Korean published patent application No. 10-2006-0010932 issued to K. O. Kim, et al., entitled "Method For Fabrication Of Semiconductor Device Using Amorphous Carbon Layer to Sacrificial Hard Mask". However, for a sacrificial hard mask including an amorphous carbon layer and a tungsten layer, a bottom tungsten layer is usually oxidized when an upper amorphous carbon layer is etched. The oxidation generates a corn-shaped tungsten oxide on the surface of tungsten layer.

FIG. 1A illustrates corn-shaped tungsten oxidation. FIG. 1B illustrates corn-shaped tungsten oxide on the peripheral region. FIG. 1C illustrates a microphotograph of upper tungsten-based hard mask by oxidation on the cell-region. Referring to FIG. 1A, corn-shaped tungsten oxide is generated on a peripheral region. Referring to FIG. 1B, a defect inspection shows that lots of corn-shaped particles on a peripheral region are damaged. In general, the corn-shaped particle is a tungsten oxide. Referring to FIG. 1C, the profile of a tungsten pattern may lack uniformity owing to the corn-shaped tungsten oxide.

As described above, for the case in which a sacrificial hard mask is formed in a double-layer structure including an amorphous carbon and a tungsten layer, the bottom tungsten layer is more likely to be oxidized when the upper amorphous carbon layer is etched. As a result, lots of corn-shaped tungsten oxide is generated on the surface of the tungsten layer. The corn-shaped tungsten oxide may affect subsequent processes and electrical characteristics of devices.

SUMMARY OF THE INVENTION

Embodiments of the present invention are directed toward providing a method for forming a pattern in a semiconductor device, which can improve an electrical characteristic and make a smooth progress of the following process by controlling an etching gas during etching of an amorphous carbon layer, and simultaneously applying a process for forming a pattern using a sacrificial hard mask including an amorphous carbon layer and a tungsten layer.

In accordance with one embodiment of the present invention, there is provided a method of fabricating a semiconductor device. The method includes forming an etch target layer, forming a sacrificial hard mask layer having a metal layer and a carbon-based material layer on the etch target layer, forming a photoresist pattern on the carbon-based material layer, etching the carbon-based material layer by the photoresist pattern until a remaining carbon-based material portion has a predetermined thickness, etching the remaining carbon-based material portion until a corresponding metal layer portion is exposed to form a carbon-based material pattern, and etching the metal layer by using the carbon-based material layer including an amorphous carbon layer.

DESCRIPTION OF SPECIFIC EMBODIMENTS

Embodiments of the present invention relate to a method for forming a pattern in semiconductor device.

FIGS. 2A to 2E illustrate cross-sectional views of a method for forming a pattern in a semiconductor device in accordance with an embodiment of the present invention. Although the embodiments of the present invention are aimed of a bit-line selected from pattern in a semiconductor device is exemplified in, it is obvious to those skilled in the art that the invention can be applied to form various patterns (e.g., gate electrodes, storage nodes, etc.).

Figure 1A:
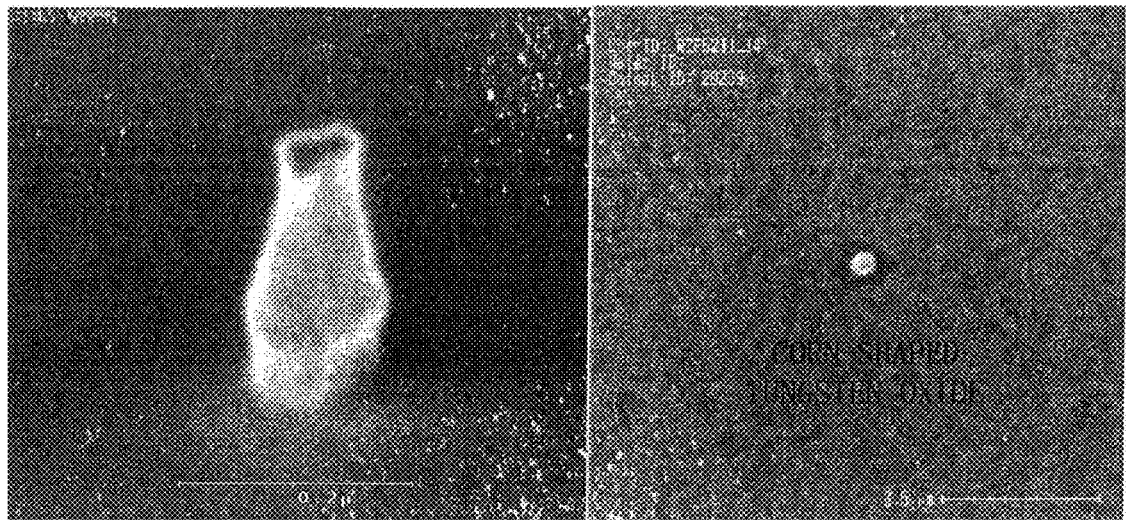
FIG. 1A illustrates a microphotograph of corn-shaped defect owing to a tungsten oxidation phenomenon.
Figure 1B:
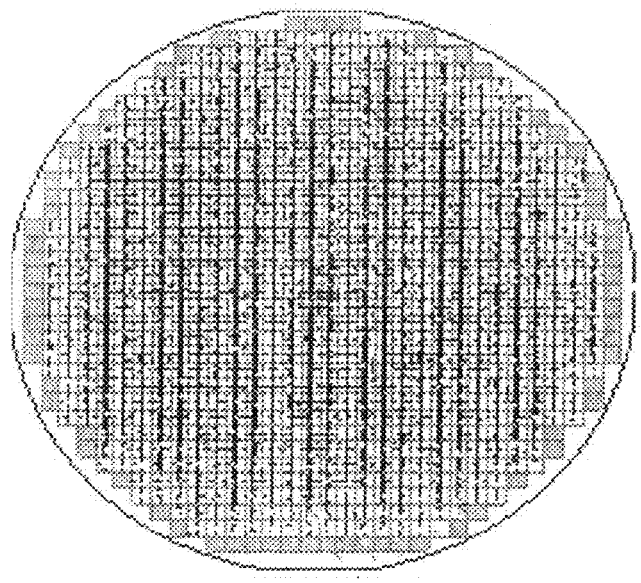
FIG. 1B illustrates a view of corn-shaped particles on the peripheral region.
Figure 1C:
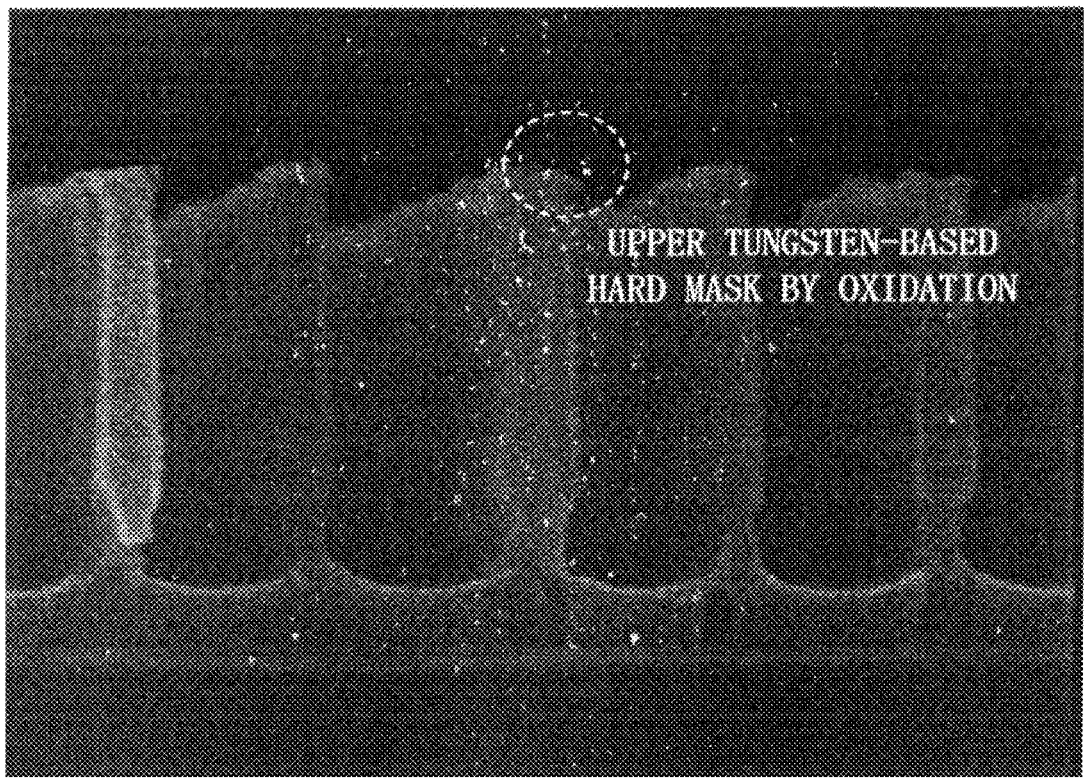
FIG. 1C illustrates a microphotograph of upper tungsten-based hard mask by oxidation on the cell-region.
Figure 2A:
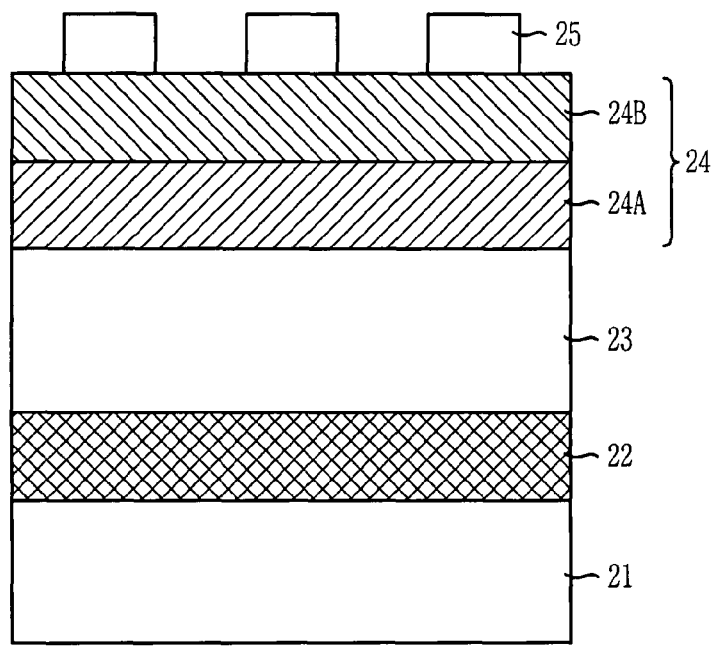
FIGS. 2A to 2E illustrate cross-sectional views of resultant structure associated with a method for forming a pattern in a semiconductor device in accordance with an embodiment of the present invention.

Referring to FIG. 2A, a conductive layer 22 is formed over a substrate 21 in which various elements of a semiconductor device are formed. The conductive layer 22 includes tungsten, and is used to form a bit line pattern in the present embodiment. An insulation layer 23 for a hard mask is formed over the conductive layer 22. The insulation layer 23 may be a thin-film, such as a family of nitride. A metal layer, e.g., a tungsten layer 24A and a carbon-based material layer, e.g., an amorphous carbon layer 24B are formed over the insulation layer 23. For a secure etching margin, a double-layer structure including the tungsten layer 24A and the amorphous carbon layer 24B serves as a sacrificial hard mask. A photoresist pattern 25 is formed over the amorphous carbon layer 24B.

Figure 2B:
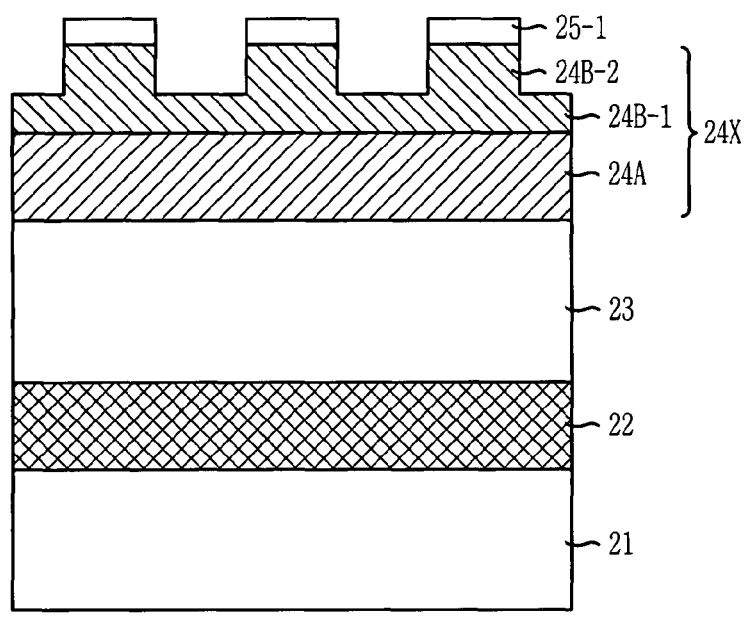
Figure 2C:
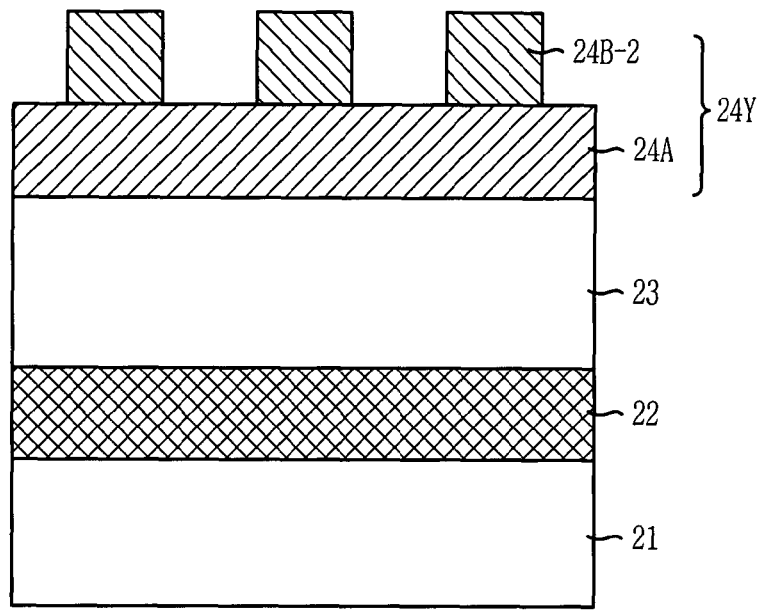
Figure 2D:
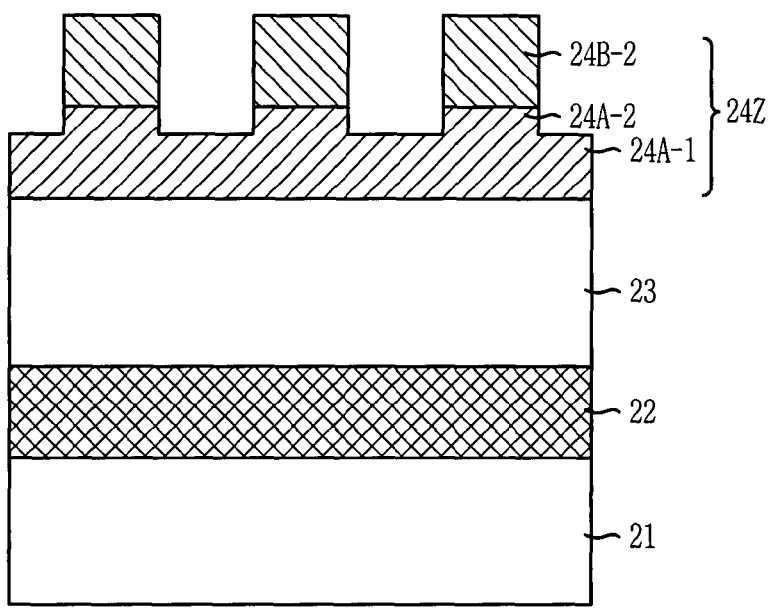

Referring to FIGS. 2B to 2D, the formation of the sacrificial hard mask will described in detail. Although the amorphous carbon layer 24B is etched using the photoresist pattern 25 (see FIG. 2A) as an etching mask, an etching of the amorphous carbon layer 24B is divided into three steps to prevent oxidation of the tungsten layer 24A formed underneath the amorphous carbon layer 24B.

Referring to FIG. 2B, the amorphous carbon layer 24B is etched using a gas mixture including $N_2$ and $O_2$ gases with the photoresist pattern 25 as an etching mask until a remaining amorphous carbon portion 24B-1 has a thickness of approximately 200 Å to approximately 500 Å. Reference numeral 24X represents the sacrificial hard mask including the remaining amorphous carbon 24B-1, an amorphous carbon pattern 24B-2, and the tungsten layer 24A. Using a gas mixture including $N_2$ and $O_2$ gases makes an etching rate of the amorphous carbon layer 24B fast and secures a sufficient etching margin of the photoresist pattern 25. Reference numeral 25-1 represents a remaining photoresist pattern after the amorphous carbon layer 24B is etched in a first step etching. However, CO and $CO_2$ gases produced during the etching of the amorphous layer 24B with the gas mixture including $N_2$ and $O_2$ gases react with tungsten, leading to oxidation of the tungsten layer 24A. Stopping etching prevents the tungsten layer 24A from oxidation before exposure of the bottom of the tungsten layer 24A.

Referring to FIG. 2C, the remaining amorphous carbon layer portion 24B-1 is etched using a gas mixture including $N_2$ and $H_2$ gases or $N_2$ and $Cl_2$ gases, thereby exposing the tungsten layer 24A. At the same time, $C_xH_y$ gas or $CCl_4$ gas produced when the remaining amorphous carbon layer portion 24B-1 is etched with the gas including $N_2$ and $H_2$ gases or $N_2$ and $Cl_2$ gases does not make the tungsten layer 24A oxidized. Thus, the gas mixture of $N_2$ and $H_2$ gases or $N_2$ and $Cl_2$ gases used during the etching of the remaining amorphous carbon layer pattern 24B-1 prevents the oxidation of the tungsten layer 24A. Reference numeral 24B-2 represents an amorphous carbon pattern. The remaining photoresist pattern 25-1 is removed during the second etching (i.e., the etching of the remaining amorphous carbon layer portion 24B-1). Reference numeral 24Y represents the sacrificial hard mask including the remaining amorphous carbon pattern 24B-2 and the tungsten layer 24A.

As aforementioned, the oxidation of the tungsten layer 24A can be prevented when the amorphous carbon layer 24B is etched in two etching steps. A third step is performed with an additional treatment on the resultant surface profile to prevent transformation of the tungsten layer 24A, which often occurs when the remaining amorphous carbon layer portion 24B-1 is etched.

In detail of the third step, referring to FIG. 2D, the tungsten layer 24A is done with a post-treatment using a mixture of plasma including $CF_4$ and Ar in the present embodiment. At the same time, the tungsten layer 24A can be removed, and a thickness of a removing tungsten portion is approximately 20 Å to approximately 100 Å. Reference numeral 24Z represents the sacrificial hard mask including the remaining amorphous carbon pattern 24B-2, an etched tungsten layer portion 24A-1, and a tungsten pattern 24A-2.

The first, second and third steps are performed in situ. The first etching is for the increase in etching rate and the second etching illustrated in FIG. 2C is performed to prevent the oxidation of the tungsten layer 24A. In addition, the third treatment for preventing the transformation of the tungsten layer 24A.

Figure 2E:
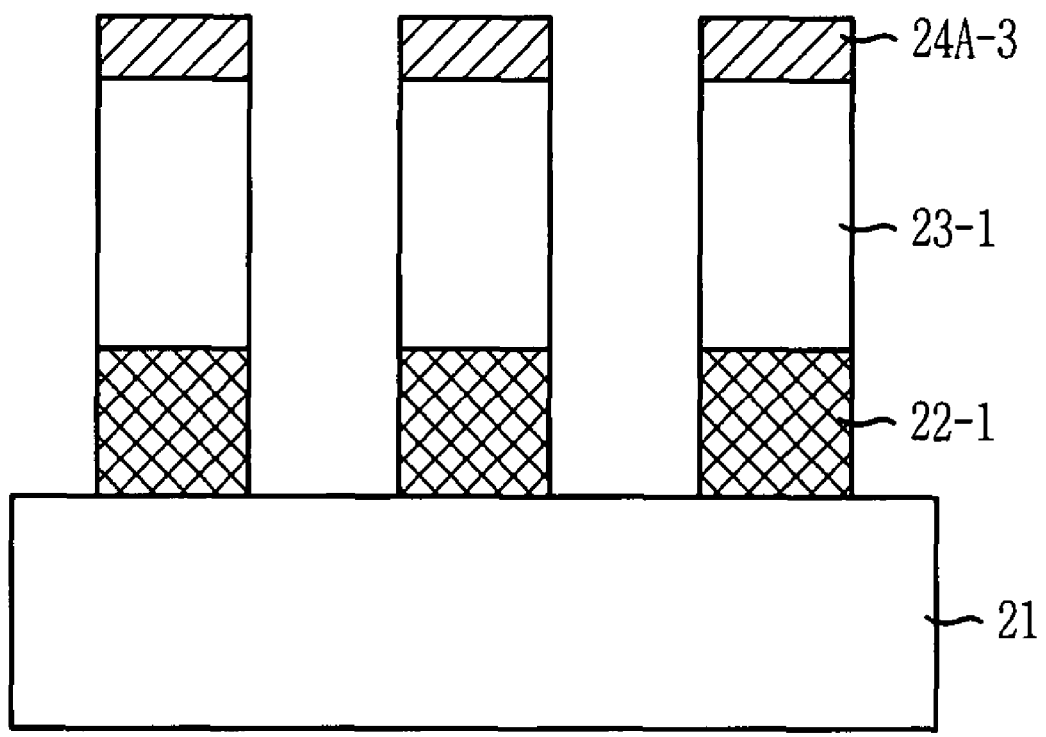

Referring to FIG. 2E, the etched tungsten layer portion 24A-1 is etched with the amorphous carbon layer pattern 24B-2 as an etch mask. Reference numeral 24A-3 represents a remaining tungsten pattern. Since the etched tungsten layer 24A-1 does not include an oxidized or transformed portion owing to the abovementioned three steps, the remaining tungsten pattern 24A-2 has a fine profile. Therefore, when a subsequent etch target layer is etched with the tungsten layer pattern 24A-2, a desired pattern can be obtained. For instance, the insulation layer 23 is etched using the tungsten layer portion 24A-1 as an etch mask to become a hard mask 23-1. The conductive layer 22 is patterned to a conductive pattern 22-1 (e.g., bit-line pattern).

Figure 3:
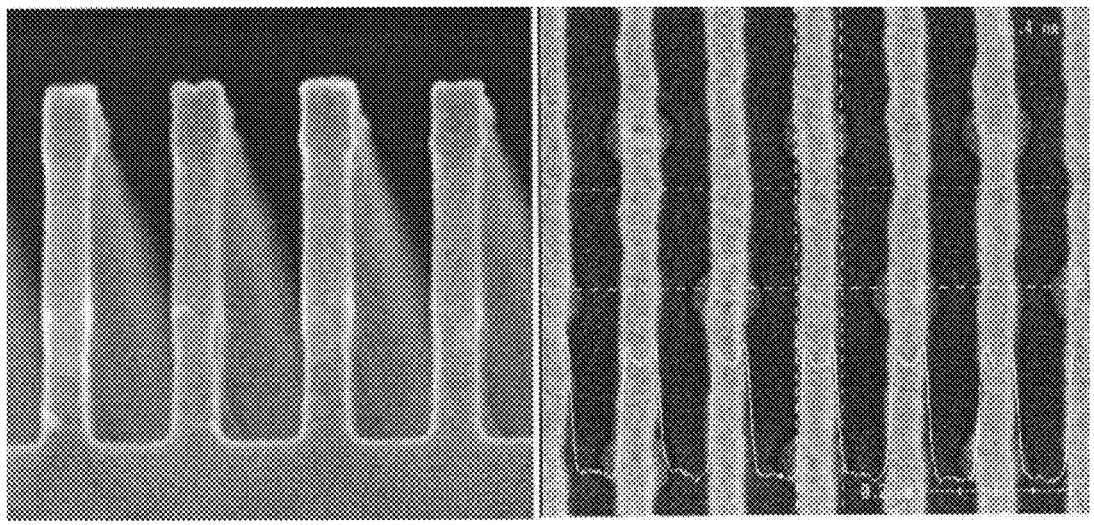
FIG. 3 illustrates microphotographs of cross-sectional and planar views of a pattern formed by a method for forming a pattern in a semiconductor device in accordance with an embodiment of the present invention.

FIG. 3 illustrates microphotographs of a cross-sectional and planar views of a pattern formed with a method for forming a pattern in a semiconductor device in accordance with an embodiment of the present invention. Because oxidation and transformation of the tungsten layer can be prevented by the abovementioned the three-step-process, a pattern having a fine profile can be formed.

In addition to the bit-line pattern formation, the pattern formation method in accordance with the embodiment of the present invention can be applied to form other patterns used in formation processes. In detail, a bottom etch target layer is etched using a sacrificial hard mask formed in a double-layer structure including an amorphous carbon layer and a tungsten layer.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for forming an etch pattern in a semiconductor device, comprising:
   forming a hard mask layer comprising a tungsten layer and an amorphous carbon layer on an etch target layer;
   selectively etching the amorphous carbon layer using a gas mixture including $N_2$ and $H_2$ or $N_2$ and $Cl_2$ to form an amorphous carbon pattern; and
   etching the tungsten layer by using the amorphous carbon pattern to form a hard mask pattern for forming the etch pattern.

2. The method of claim 1, further comprising:
   etching the etch target layer by using the hard mask pattern as an etch barrier.

3. The method of claim 1, wherein selectively etching the amorphous carbon layer, includes:
   etching the amorphous carbon layer until a remaining amorphous carbon layer portion has a certain thickness; and
   etching the remaining amorphous carbon layer portion using the gas mixture including $N_2$ and $H_2$ or $N_2$ and $Cl_2$.

4. The method of claim 1, wherein the etch target layer includes a conductive layer.

5. The method of claim 3, wherein the etching the amorphous carbon layer until a remaining amorphous carbon layer portion has a certain thickness, comprises using a gas mixture having a fast etching rate of the amorphous carbon and providing a sufficient etching margin.

6. The method of claim 3, wherein the remaining amorphous carbon layer portion has a thickness of approximately 200 Å to approximately 500 Å.

7. The method of claim 3, wherein etching the remaining amorphous carbon layer portion comprises using a gas mixture providing resultants not reacting with the tungsten layer.

8. The method of claim 3, wherein after etching the remaining amorphous carbon layer portion, etching the tungsten layer comprises removing a portion of the exposed tungsten layer with an additional treatment by a mixture of plasma.

9. The method of claim 4, wherein the etch pattern includes a bit-line.

10. The method of claim 5, wherein the gas mixture used for etching the amorphous carbon layer comprises $N_2$ and $O_2$ gases.

11. The method of claim 8, wherein the mixture of plasma includes $CF_4$ and Ar.

12. The method of claim 8, wherein the removed portion of the exposed tungsten layer portion has a thickness of approximately 20 Å to approximately 100 Å.

13. The method of claim 8, wherein etching the amorphous carbon layer, etching the remaining amorphous carbon layer portion, and removing a portion of the exposed tungsten layer are performed in situ.

14. A method for forming an etch pattern in a semiconductor device, comprising:

forming a hard mask layer comprising a tungsten layer and an amorphous carbon layer on a etch target layer;

selectively etching the amorphous carbon layer until a remaining amorphous carbon layer portion has a certain thickness;

etching the remaining amorphous carbon layer portion until a corresponding tungsten layer portion is exposed to form an amorphous carbon pattern;

etching the tungsten layer comprises removing a portion of the exposed tungsten layer;

etching a remaining tungsten layer portion by using the amorphous carbon pattern as an etch mask to form a tungsten pattern; and etching the etch target layer by using the tungsten pattern as an etch mask to form an etch pattern.

15. The method of claim 14, wherein etching the amorphous carbon layer comprises using a gas mixture including $N_2$ and $O_2$ gases.

16. The method of claim 14, wherein etching the remaining amorphous carbon layer portion comprises using a gas mixture including $N_2$ and $H_2$ or $N_2$ and $Cl_2$.

17. The method of claim 14, wherein etching the tungsten layer comprise using a gas mixture of plasma including $CF_4$ and Ar.

* * * * *